US011696418B2

(12) United States Patent
Banakar et al.

(10) Patent No.: US 11,696,418 B2
(45) Date of Patent: Jul. 4, 2023

(54) RECOMMENDING IT EQUIPMENT PLACEMENT BASED ON INFERRED HARDWARE CAPABILITIES

(71) Applicant: HEWLETT PACKARD ENTERPRISE DEVELOPMENT LP, Houston, TX (US)

(72) Inventors: Vinay Sahadevappa Banakar, Bangalore (IN); Pavan Belur Gopalakrishna Upadhya, Bangalore (IN); Maneesh Keshavan Bendiganavale, Bangalore (IN)

(73) Assignee: Hewlett Packard Enterprise Development LP, Spring, TX (US)

( * ) Notice: Subject to any disclaimer, the term of this patent is extended or adjusted under 35 U.S.C. 154(b) by 525 days.

(21) Appl. No.: 16/860,631

(22) Filed: Apr. 28, 2020

(65) Prior Publication Data

US 2021/0014998 A1   Jan. 14, 2021

(30) Foreign Application Priority Data

Jul. 12, 2019   (IN) .............................. 201941028122

(51) Int. Cl.
| | | |
|---|---|---|
| *G06F 3/048* | (2013.01) | |
| *H05K 7/14* | (2006.01) | |
| *H05K 7/20* | (2006.01) | |
| *G06Q 10/06* | (2023.01) | |
| *G06N 5/04* | (2023.01) | |
| *H05K 7/18* | (2006.01) | |

(52) U.S. Cl.
CPC ............. *H05K 7/1498* (2013.01); *G06N 5/04* (2013.01); *G06Q 10/06* (2013.01); *H05K 7/18* (2013.01); *H05K 7/20836* (2013.01)

(58) Field of Classification Search
CPC .... H05K 7/1498; H05K 7/18; H05K 7/20836; G06N 5/04; G06Q 10/06
See application file for complete search history.

(56) References Cited

U.S. PATENT DOCUMENTS

| | | | | |
|---|---|---|---|---|
| 8,098,658 | B1 * | 1/2012 | Ranganathan | .......... H04L 45/00 370/254 |
| 9,182,480 | B2 * | 11/2015 | Larson | .................. G01S 13/751 |
| 10,536,340 | B1 * | 1/2020 | Manning | ............. H04L 41/0895 |
| 11,150,995 | B1 * | 10/2021 | Dhoolam | ............ G06F 16/9535 |
| 2006/0259793 | A1 * | 11/2006 | Moore | .................... G06F 1/206 713/300 |

(Continued)

FOREIGN PATENT DOCUMENTS

| | | | | | |
|---|---|---|---|---|---|
| AU | 2009269067 A1 * | 1/2011 | ............... | G06F 1/26 |
| AU | 2013316655 A1 * | 3/2015 | ............. | G06F 30/13 |

(Continued)

*Primary Examiner* — Rashawn N Tillery
(74) *Attorney, Agent, or Firm* — Trop, Pruner & Hu, P.C.

(57) ABSTRACT

In some examples, a method includes: determining workload constraints for placement of information technology (IT) equipment within a data center; determining physical constraints for placement of the IT equipment; inferring hardware placement capabilities of IT equipment racks within the data center; and generating a ranked list of locations for IT equipment placement within the data center based on the determined workload constraints, determined physical constraints, and inferred hardware placement capabilities.

20 Claims, 7 Drawing Sheets

(56) References Cited

U.S. PATENT DOCUMENTS

| | | | | |
|---|---|---|---|---|
| 2009/0138313 | A1* | 5/2009 | Morgan | H05K 7/2079 |
| | | | | 705/7.23 |
| 2011/0238340 | A1* | 9/2011 | Dasgupta | G06F 30/00 |
| | | | | 702/61 |
| 2012/0124194 | A1* | 5/2012 | Shouraboura | H04L 45/126 |
| | | | | 709/224 |
| 2012/0284216 | A1* | 11/2012 | Hamann | G06F 1/206 |
| | | | | 706/12 |
| 2017/0086325 | A1* | 3/2017 | Connor | H05K 7/1488 |
| 2018/0024700 | A1* | 1/2018 | Dadd | G06N 5/022 |
| | | | | 715/736 |
| 2020/0162342 | A1* | 5/2020 | Fattu | H04L 41/16 |
| 2021/0037466 | A1* | 2/2021 | Silva | G06F 1/3225 |
| 2022/0022344 | A1* | 1/2022 | Jose | G06F 1/324 |
| 2022/0240408 | A1* | 7/2022 | Faulkner | G06F 9/5094 |

FOREIGN PATENT DOCUMENTS

| | | | | |
|---|---|---|---|---|
| EP | 3693879 A1 * | 8/2020 | | G06F 21/53 |
| WO | WO-2008144375 A2 * | 11/2008 | | G06Q 10/06 |
| WO | WO-2022178026 A1 * | 8/2022 | | |

* cited by examiner

RECOMMENDING IT EQUIPMENT PLACEMENT BASED ON INFERRED HARDWARE CAPABILITIES

BACKGROUND

Cloud computing has significantly affected the way Information Technology ("IT") infrastructure is being consumed. For example, it is possible to deploy workloads using a variety of physical and virtual infrastructure ranging from public cloud environments to on premise data centers that rely on local hardware. New workloads are continuously being created, deployed, and consumed for applications via such physical and virtual infrastructure. The selection of IT equipment placement locations within a data center or across data centers that complies with workload and other requirements can an important consideration for data center administrators.

DETAILED DESCRIPTION

Figure 1:
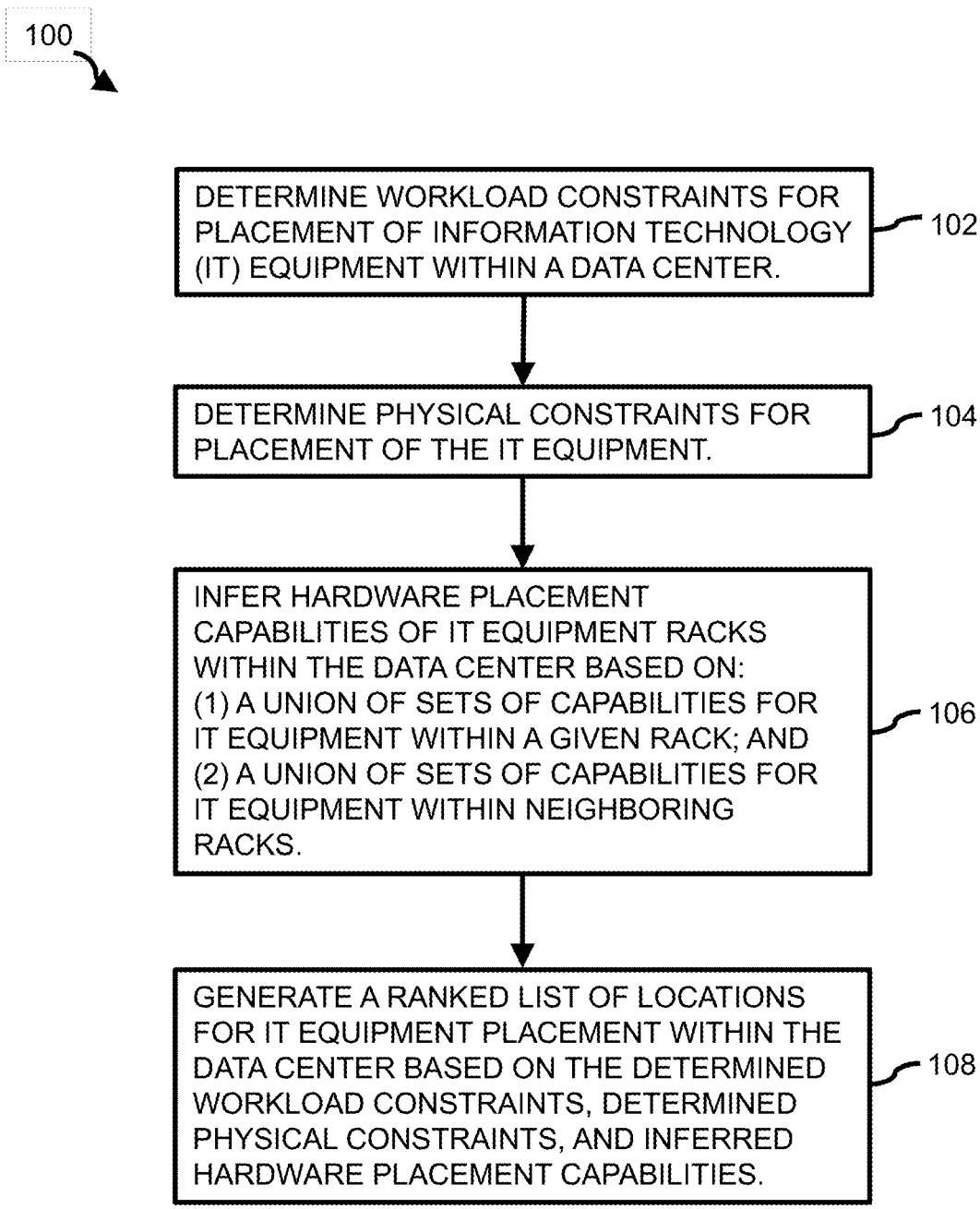
FIG. 1 is a flowchart for a method, according to an example.

The following discussion is directed to various examples of the disclosure. Although one or more of these examples may be preferred, the examples disclosed herein should not be interpreted, or otherwise used, as limiting the scope of the disclosure, including the claims. In addition, the following description has broad application, and the discussion of any example is meant only to be descriptive of that example, and not intended to intimate that the scope of the disclosure, including the claims, is limited to that example. Throughout the present disclosure, the terms "a" and "an" are intended to denote at least one of a particular element. In addition, as used herein, the term "includes" means includes but not limited to, the term "including" means including but not limited to. The term "based on" means based at least in part on.

There are many different factors that influence the placement of Information IT hardware (e.g., servers, switches, storage devices, etc.) in the data center. These factors can, for example, include physical limitations to connect to a network (e.g., Ethernet or storage networks), power requirements, temperature and cooling considerations, physical space, etc. In addition to these considerations, there may further be custom requirements driven by workload policies (such as security and data privacy), which may also influence the placement of hardware. For example, if the intent of the hardware is to host a Network Attached Storage (NAS) server on a private network, then this may require the hardware to be on a specific subnet running over a high speed Ethernet network. The hardware also may need to be connected to specific storage networks with high storage capacity. In addition, in some situations, there may be additional constraints of space, power availability, and cooling.

In such a scenario, an ideal placement of a server that satisfies the above criteria may require an empty slot in a rack that: (1) has a close physical proximity to a high-speed Ethernet switch that is already configured for the intended subnet; (2) has a close physical proximity to a high speed SAN switch, which is in turn connected to a storage system satisfying the storage capacity and availability requirements; (3) has sufficient power available to power the server during peak loads; (4) has an ambient temperature that conforms to server run-time temperature specifications. In view of the above considerations and others, it can be challenging for a data center administrator to identify an optimal location to place new hardware in order to fulfill all the requirements of the workloads intended to be run on the hardware.

Certain implementations of the present disclosure are directed to a system that provides intent-driven hardware placement recommendations using a rack capability inference engine. In some implementations, a method can include: (a) determining workload constraints for placement of IT equipment within a data center; (b) determining physical constraints for placement of the IT equipment; (c) inferring hardware placement capabilities of IT equipment racks within the data center; and (d) generating a ranked list of locations for IT equipment placement within the data center based on the determined workload constraints, determined physical constraints, and inferred hardware placement capabilities.

Certain implementations of the present disclosure may allow for various advantages compared to existing solutions. For example, certain implementations may provide one or more of the following advantages: (1) reduced turnaround time to move new hardware from factory to production; (2) maximized hardware resource usage; (3) reduced data center downtime induced by placing the hardware in a wrong location (which may also reduce unnecessary power usage), (4) reduced temperature and inefficient network wiring (both of which are common reasons for hardware degradation); (5) the inclusion of unique application requirements embedded directly in the hardware infrastructure (e.g., privacy and security policies); (6) the ability to freely move hardware around a data center or data centers while keeping hardware configuration states intact (which may also lead to less down time); and (7) reorganizing data center hardware locations to cater to different workload requirements running in the data center or data centers. Other advantages of implementations presented herein will be apparent upon review of the description and figures.

FIG. 1 depicts a flowchart for an example method 100 related to recommending IT equipment placement based on inferred hardware capabilities. In some implementations, method 100 can be implemented or otherwise executed through the use of executable instructions stored on a memory resource (e.g., the memory resource of the computing device of FIG. 6), executable machine readable instructions stored on a storage medium (e.g., the medium of FIG. 7), in the form of electronic circuitry (e.g., on an Application-Specific Integrated Circuit (ASIC)), and/or another suitable form. Although the description of method 100 herein primarily refers to steps performed on a server for purposes of illustration, it is appreciated that in some implementations, method 100 can be executed on another computing device. In some implementations, method 100 can be executed on network devices in parallel (e.g., in a distributed computing fashion).

Method 100 includes determining (at block 102) workload constraints for placement of IT equipment within a data center. It is appreciated that in some implementations, block 110 can include determining workload constraints for placement of IT equipment across multiple data centers. In some implementations, such workload constraints can include infrastructure-related constraints, such as compute, memory, bandwidth, and/or storage constraints for a given workload. In some implementations, such workload constraints can include data-specific constraints, such as security policy or data privacy constraints for a given workload. Additional examples and aspects of such workload constraints are described in detail elsewhere herein.

Method 100 includes determining (at block 104) physical constraints for placement of the IT equipment. In some implementations, such physical constraints can, for example, include network constraints for a given rack (e.g., constraints related to network connectivity). In some implementations, such physical constraints can, for example, include power constraints for a given rack (e.g., constraints related to power reliability or input). In some implementations, such physical constraints can, for example, include thermal constraints for a given rack (e.g., constraints related to average temperature or maximum temperature). Additional examples and aspects of such physical constraints are described in detail elsewhere herein.

Method 100 includes inferring (at block 106) hardware placement capabilities of IT equipment racks within the data center. It is appreciated that in some implementations, block 106 can include inferring hardware placement capabilities of IT equipment racks across multiple data centers. In some implementations, the inferred capabilities are based on a union of sets of capabilities for IT equipment within a given rack and a union of sets of capabilities for IT equipment within neighboring racks. In some implementations, the union of sets of capabilities for IT equipment within a rack includes the union of sets of networks that any server can be connected to when placed within the rack. Additional examples and aspects of the above interring operation are described in detail elsewhere herein.

In some implementations, the union of sets of capabilities for IT equipment within neighboring racks is weighted based on physical proximity of each neighboring rack relative to the given rack. In some implementations, the physical proximity of each neighboring rack relative to the given rack is based on location services data that indicates a floor plan for the data center. In some implementations, the physical proximity of each neighboring rack relative to the given rack is determined based on a breadth first search (BFS) analysis between source and destination racks. Additional examples and aspects of the above physical proximity determination and weighting operations are described in detail elsewhere herein.

Method 100 includes generating (at block 108) a ranked list of locations for IT equipment placement within the data center based on the determined workload constraints, determined physical constraints, and inferred hardware placement capabilities. It is appreciated that in some implementations, method 100 can leverage ranking information beyond generating a ranked list per se. For example, a ranking value, recommendation score, or the like, may be stored for direct or indirect retrieval by a human operator or automated recommendation engine. Additional examples and aspects of the above recommendation operations are described in detail elsewhere herein.

It is appreciated that one or more operations of method 100 can be performed periodically. For example, in some implementations, one or more of blocks 102, 104, 106, and 108 (or other operations described herein) may be performed periodically. The various period times for blocks 102, 104, 106, and 108 (or other operations described herein) may be the same or different times. For example, in some implementations, the period of block 102 is every 10 minutes and the period of block 104 is every 20 minutes. It is further appreciated, that the period for a given block may be regular (e.g., every 5 minutes) or may be irregular (e.g., every 5 minutes during a first condition, and every 10 minutes during a network condition). In some implementations, one or more of block 102, 104, 106, and 108 (or other operations described herein) may be non-periodic and may be triggered by some network or other event.

Although the flowchart of FIG. 1 shows a specific order of performance, it is appreciated that this order may be rearranged into another suitable order, may be executed concurrently or with partial concurrence, or a combination thereof. Likewise, suitable additional and/or comparable steps may be added to method 100 or other methods described herein in order to achieve the same or comparable functionality. In some implementations, one or more steps are omitted. For example, in some implementations, block 104 of determining physical constraints can be omitted from method 100 or performed by a different device. It is appreciated that blocks corresponding to additional or alternative functionality of other implementations described herein can be incorporated in method 100. For example, blocks corresponding to the functionality of various aspects of implementations otherwise described herein can be incorporated in method 100 even if such functionality is not explicitly characterized herein as a block in method 100.

Various example implementations for the present disclosure will now be described. It is appreciated that these examples may include or refer to certain aspects of other implementations described herein (and vice-versa), but are not intended to be limiting towards other implementations described herein. Moreover, it is appreciated that certain aspects of these implementations may be applied to other implementations described herein.

Certain implementations of the present disclosure can provide a ranked list of locations for server placement based on the intended workload, connectivity and physical requirements of the server. Certain implementations may first infer the capabilities of all racks in the data center based on the connections to Ethernet and storage networks for servers residing in each of the racks. Additionally, physical constraints such as space, power and temperature can be applied along with any custom workload policies or other criteria. Certain implementations of the present disclosure can be used to reduce the overall time taken to move hardware from factory to production and also maximize hardware utilization while minimizing down time.

Certain implementations of the present disclosure are directed to a system that can identify an ideal slot for a given hardware by identifying a rack with an empty slot that has connectivity to each of the required Ethernet and storage networks (e.g., capabilities) while also satisfies the constraints of physical size (e.g., "U" size), temperature, cooling and power requirements, along with any custom constraints imposed by the application workloads.

Figure 2:
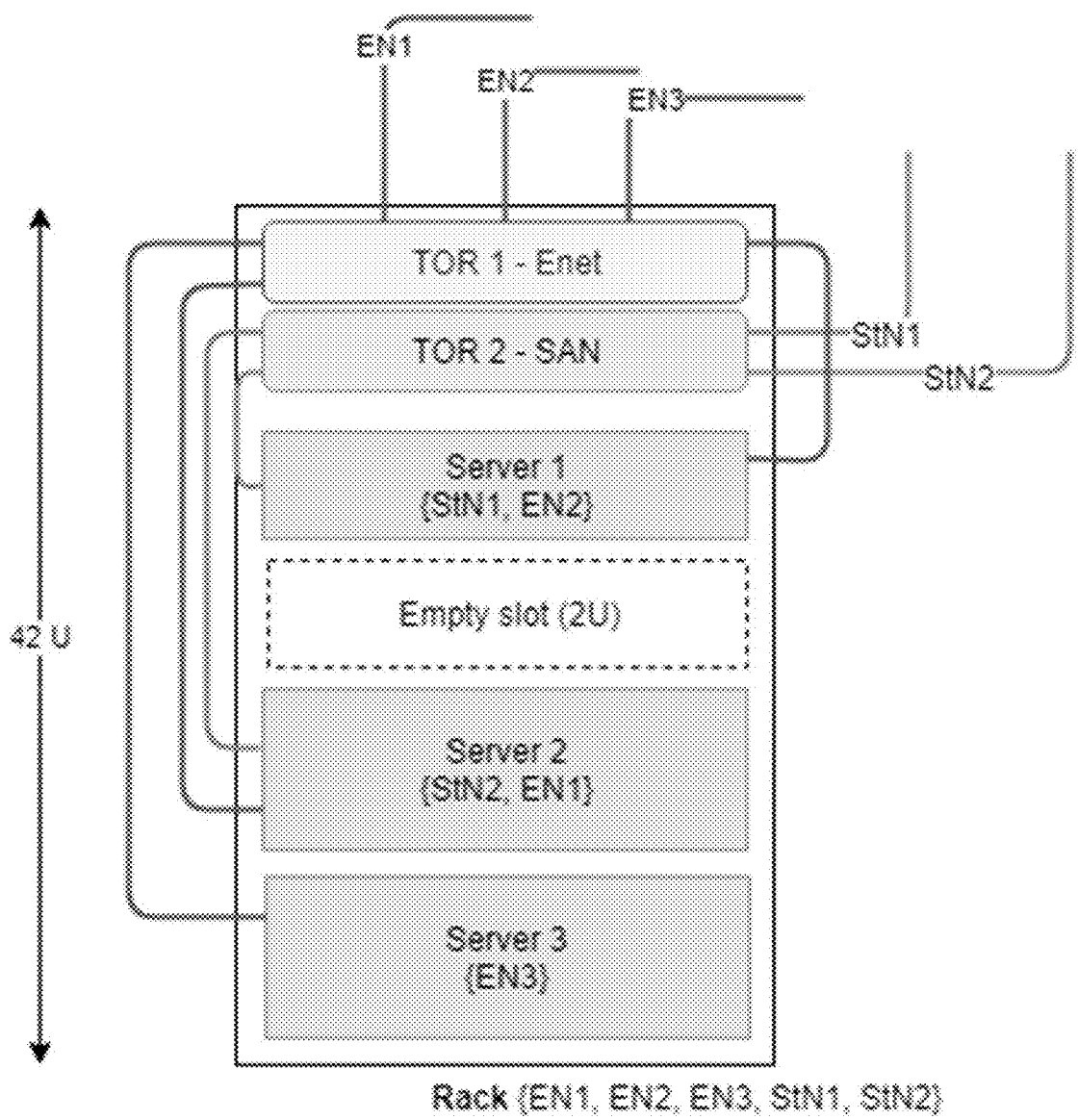
FIG. 2 is an illustration of a rack, according to an example.

Certain implementations of the present disclosure may begin by first identifying Absolute Rack Capabilities (ARC)

for a given rack. For example, consider a rack containing one or more servers connected to a multiple Ethernet subnets and storage networks (see the rack of FIG. 2). Each of the server nodes can, for example, map to a Capability Set (CS), whose elements constitutes one or more capabilities. Such capabilities can include: (a) an Ethernet subnet such as VLAN1 (15.22.xx.xx), VLAN2 (192.168.xx.xx), etc.; and (b) a storage network such as FC/FCoE, ISCSI, SAS, etc., to which the server is connected.

The ARC can be defined as a set that is a union of the sets of capabilities of each individual server placed in the rack. The ARC for a rack can, for example, identify a set of networks that any server can be connected to when placed in that rack. For example:

For a Rack R with Servers $\{S_1, S_2, \ldots, S_n\}$, let:

EN represents a set comprising of all the Ethernet subnets in the environment.

StN represents a set comprising of all the Storage networks in the environment.

$EN=\{EN_1, EN_2, \ldots, EN_x\}$
$StN=\{StN_1, StN_2, \ldots, StN_y\}$

Let CS be the Capability Set for Server (S)
The Capability Set for each of the servers are as below:
$CS_1=\{EN_1, EN_2, StN_1, StN_2\}$
where $\{EN_1, EN_2\} \in EN$
and $\{StN_1, StN_2\} \in StN$
$CS_2=\{EN_2, EN_3, EN_4, StN_3, StN_4\}$
where $\{EN_2, EN_3, EN_4\} \in EN$
and $\{StN_3, StN_4\} \in StN$
$CS_n=\{EN_5, EN_6, StN_1, StN_5\}$
where $\{EN_5, EN_6\} \in EN$
and $\{StN_1, StN_5\} \in StN$ The ARC can, for example, be defined as:
$ARC=CS_1 \cup CS_2 \cup \ldots \cup CS_n$
$ARC=\{EN_1, EN_2, EN_3, EN_4, EN_5, EN_6, StN_1, StN_2, StN_3, StN_4, StN_5\}$ Certain implementations of the present disclosure may identify Extended Rack Capabilities (ERC) for a given rack. Along with the ARC of a given rack, the capabilities of the given rack can be extended by looking at the ARCs of one or more of its neighboring racks. Such ERCs can have a score multiple associated with it based on the physical proximity of the neighboring racks relative to the rack for which the ERCs are being calculated. One way to identify proximity is by using location services to generate a floor plan for a data center (or data centers). For example, and referencing FIG. 3, an example data center can be modeled as a matrix where each element represents a rack:

$$DC = \begin{vmatrix} R_{11} & R_{12} & E & R_{14} \\ R_{21} & E & R_{23} & r_{24} \\ R_{31} & R_{32} & R_{33} & R_{34} \end{vmatrix}$$

Figure 3:
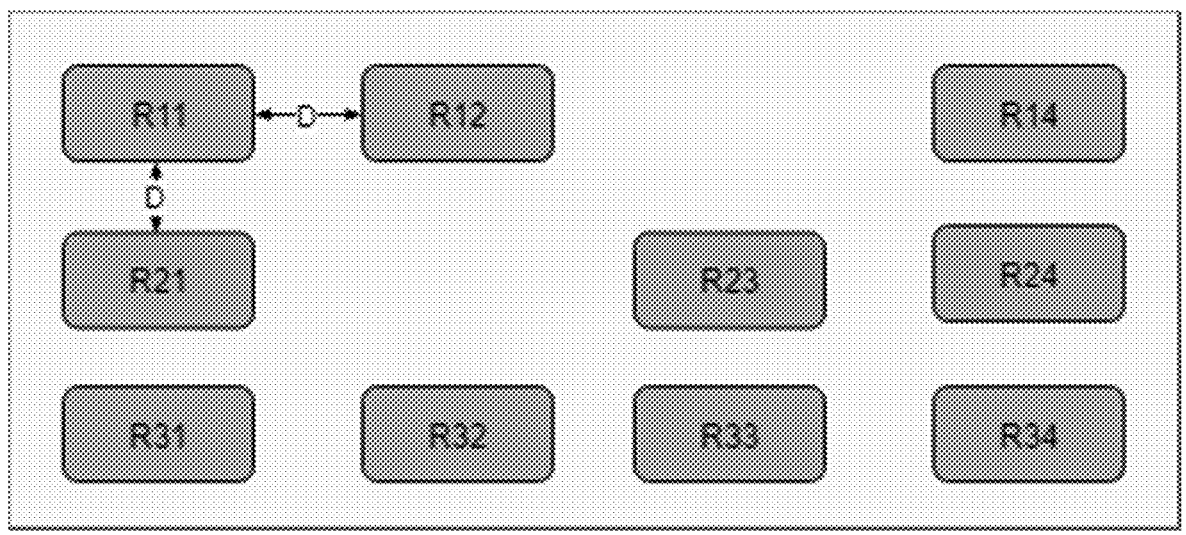
FIG. 3 is an illustration of an example data center floor plan, according to an example.

In such an example, the distance between two racks is represented by a constant D (assuming all the racks are equidistant for simplicity). In this example, empty rack positions are denoted by E in the above matrix. Relative rack capabilities are calculated by associating a score multiple to a neighboring rack's ARC. As shown in FIG. 3, the score multiple associated with ERC for rack $R_{11}$ with respect to rack $R_{12}$ is 1/D. Similarly the score multiple between $R_{11}$ and $R_{14}$ is 1/3D and the score multiple between $R_{11}$ and $R_{31}$ is 1/2D. So the probability of rack $R_{11}$ having the capabilities of rack $R_{14}$ supported is 1/3D*ERC(R_14).

This can also be written as:

$$ERC(R_{11}) = \frac{1}{D} * ERC(R_{12}) + \frac{1}{3D} * ERC(R_{14}) + \frac{1}{2D} * ERC(R_{31}) + \ldots$$

Because data centers typically do not have diagonal network wirings, we can consider racks as only being connected up, down, right or left (relative to the floor plan of FIG. 3). As a result, the shortest distance between two racks in a data center can be derived from a Breadth-First Search (BFS) between the source the destination racks. In the above example:

$BFS(R_{11}, R_{31})=2D$ And similarly $BFS(R_{23}, R_H)=3D$

After generalizing for a matrix with row p and q we arrive at:

$$ERC(R_{xy}) = \sum_{\{m=0, n=0\}}^{\{p,q\}} \left[ \frac{1}{BFS(R_{xy}, R_{mn})} \right] * ARC(R_{mn})$$

It is appreciated that the above equation can be used to calculate a physical proximity factor for relative rack capabilities in accordance with certain implementations of the present disclosure.

Certain implementation of the present disclosure may next apply physical constraints. For example, physical constraints for placing a server in a data center can include: (1) physical space required to place the server, which can, for example, refer to empty slots that match the server form factor; (2) power requirements, which can, for example, refer to a rack that can meet the power requirements of the server; and (3) temperature and cooling requirements, which can, for example, refer to a rack which can provide required cooling while also sustaining an operational ambient temperature enforced by the server.

In order to identify the appropriate slot to place the server (or other hardware), physical constraints can be applied and the appropriate racks that meet those constraints can be identified. For the identified racks, the best fit slots can be ordered or assigned a score based on the combination of ARCs and the ERCs.

For example consider a server with the following properties and requirements,

Properties:
a. Server form factor=2U
b. Server maximum power=175 W
c. Server temperature range=10 C to 35 C Requirements:
a. Network needs to be connected to 15.146.xx.xx subnet and 16.125.xx.xx subnet
b. Needs to be connected to a 3PAR flash storage over fiber channel with 100 Gb of memory with 10 Gb/s speed.

Figure 4:
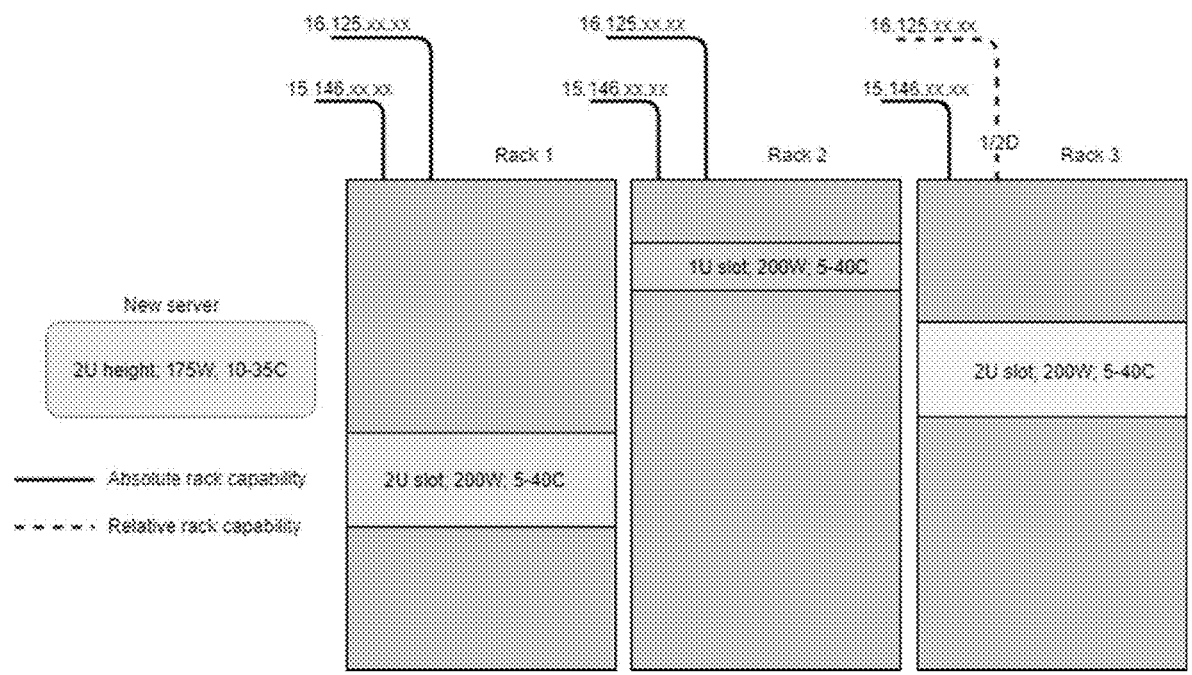
FIG. 4 is a diagram of a portion of a data center, according to an example.

Let's assume the data center has following three racks (as shown in diagram FIG. 4):

Rack 1
Has empty 2U slots
Ambient temperature on the rack is 5 C to 40 C
Maximum power available on the rack is 200 W After discovering the rack capability of the server as discussed above we now know Rack1 has subnets 15.146.xx.xx and 16.125.xx.xx and has storage connectivity of 200 Gb capacity and 20 Gb/s speed.

Rack 2
Has empty 1U slots
Ambient temperature on the rack is 5 C to 40 C
Maximum power available on the rack is 200 W After discovering the rack capability of the server as discussed above we now know Rack1 has subnets 15.146.xx.xx and 16.125.xx.xx and has storage connectivity of 200 Gb capacity and 20 Gb/s speed.

Rack 3
Has empty 4U slots
Ambient temperature on the rack is 5 C to 40 C
Maximum power available on the rack is 200 W After discovering the rack capability of the server as discussed above we now know Rack 3 has subnet 15.146.xx.xx and has storage connectivity of 200 Gb capacity and 20 Gb/s speed. However, the physical proximity of this rack with respect to Rack 1 is 2D, so the extended rack capability is 1/2D [16.125.xx.xx subnet] which indicates a capability of 0.5 for a server in Rack3 to have connection to 16.125.xx.xx subnet.

After applying physical constraints, Rack 2 is deprioritized because it does not meet the minimum requirement of having an empty 2U slot although it met the capability and other physical requirements. Both Rack 1 and 3 meet the physical constraints with equal score. Hence, the capabilities are considered in order to rank them. Since the computed Rack 1 capabilities meets all given capability requirements and Rack 3 supports 15.146.xx.xx subnet and has capability of only 1/2D for 16.125.xx.xx subnet, Rack 1 is ranked higher than Rack 3. This makes Rack 1 the best fit to place the server.

Figure 5:
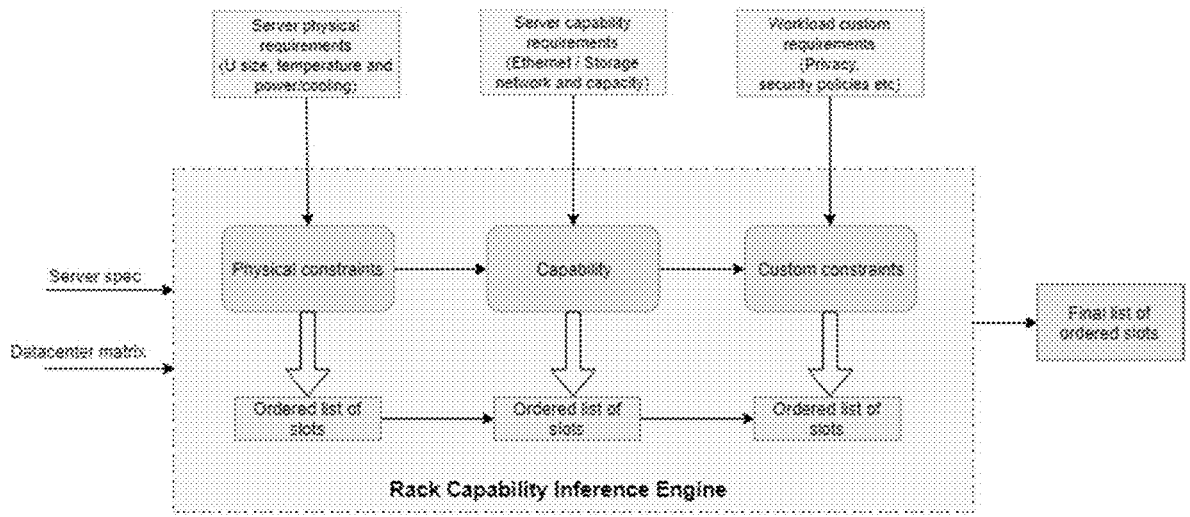
FIG. 5 is a diagram of a rack capability inference engine, according to an example.

Certain implementations of the present disclosure may apply custom constraints. For example, along with the above two constraints, often enterprise customers will have their own constraints while running their workloads. Such constraints can, for example, include: (a) privacy policy (e.g., GDPR requirements) and (2) security policy (e.g., high security data center requirements). The framework shown in FIG. 5 demonstrates a mechanism to add or remove many such constraints to finally decide the right fit slot for the new hardware. Each constraint is independent in itself which means customers can choose to pick just capability constraints and reorganize the data center physically to meet its requirements.

It is appreciated that this concept can be extended to support multiple data center slot predictions at once. For example planning placement of a new hardware between four data centers can be done by applying physical and capabilities logic individually to each data center and from its result, then decide which to pick based on custom constraints, such as GDPR which requires application to reside in same country.

Certain IT infrastructure management tools may already collect detailed capabilities of a server which is associated with a corresponding server hardware type. These capabilities can be used to define server profiles for the server, such a profile can include a list of connections that a server is connected to (e.g., Ethernet and Storage). Details like these can be used to calculate the ARC for the rack the server is residing in. A data center view feature available in some IT infrastructure management tools may further be used to collect the exact location of the rack and servers (and other hardware), this view can, for example, be enhanced for the administrators to determine the possible locations for placing a new hardware or an existing hardware.

Figure 6:
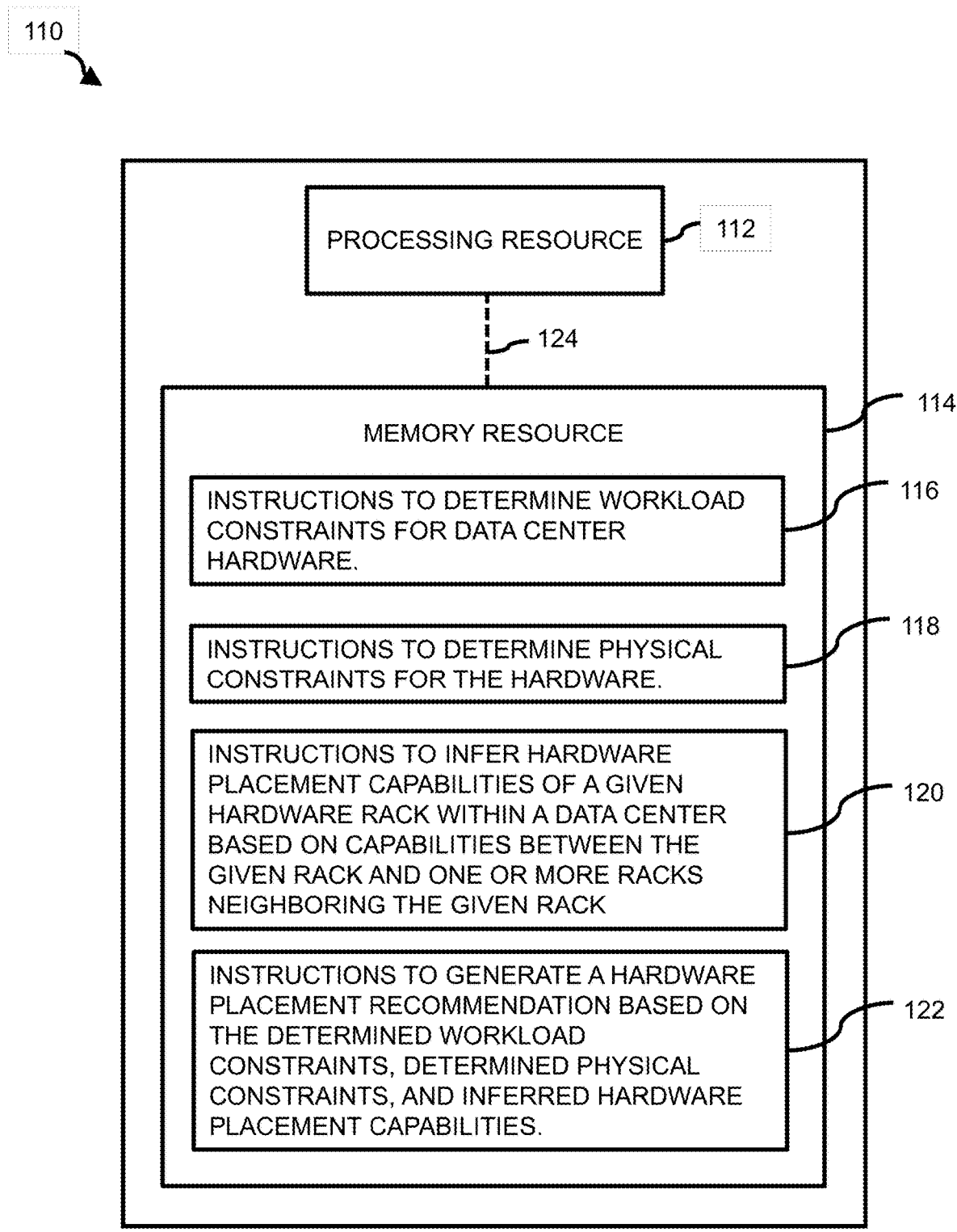
FIG. 6 is a diagram of a computing device, according to an example.

FIG. 6 is a diagram of a computing device 110 in accordance with the present disclosure. Computing device 110 can, for example, be in the form of a server or another suitable computing device. In some implementations, computing device 110 can be a server. As described in further detail below, computing device 110 includes a processing resource 112 and a memory resource 114 that stores machine-readable instructions 116, 118, 120, and 122. For illustration, the description of computing device 110 makes reference to various aspects of the FIGS. 1-5. However it is appreciated that computing device 110 can include additional, alternative, or fewer aspects, functionality, etc., than the implementations described elsewhere herein and is not intended to be limited by the related disclosure thereof.

Instructions 116 stored on memory resource 114 are, when executed by processing resource 112, to cause processing resource 112 to determine workload constraints for data center hardware. Instructions 116 can incorporate one or more aspects of blocks of method 100 or another suitable aspect of other implementations described herein (and vice versa). Instructions 118 stored on memory resource 114 are, when executed by processing resource 112, to cause processing resource 112 to determine physical constraints for the hardware. Instructions 118 can incorporate one or more aspects of blocks of method 100 or another suitable aspect of other implementations described herein (and vice versa).

Instructions 120 stored on memory resource 114 are, when executed by processing resource 112, to cause processing resource 112 to infer hardware placement capabilities of a given hardware rack within a data center based on capabilities between the given rack and one or more racks neighboring the given rack. In some implementations, the neighboring racks include racks within a close physical proximity to the given rack. Instructions 120 can incorporate one or more aspects of blocks of method 100 or another suitable aspect of other implementations described herein (and vice versa).

Instructions 122 stored on memory resource 114 are, when executed by processing resource 112, to cause processing resource 112 to generate a hardware placement recommendation based on the determined workload constraints, determined physical constraints, and inferred hardware placement capabilities. In some implementations, generating a hardware placement recommendation is based on whether inferred hardware placement capabilities for a given hardware placement satisfies the determined workload constraints, and determined physical constraints. Instructions 122 can incorporate one or more aspects of blocks of method 100 or another suitable aspect of other implementations described herein (and vice versa).

Processing resource 112 of computing device 110 can, for example, be in the form of a central processing unit (CPU), a semiconductor-based microprocessor, a digital signal processor (DSP) such as a digital image processing unit, other hardware devices or processing elements suitable to retrieve and execute instructions stored in memory resource 114, or suitable combinations thereof. Processing resource 112 can, for example, include single or multiple cores on a chip, multiple cores across multiple chips, multiple cores across multiple devices, or suitable combinations thereof. Processing resource 112 can be functional to fetch, decode, and execute instructions as described herein. As an alternative or in addition to retrieving and executing instructions, processing resource 112 can, for example, include at least one integrated circuit (IC), other control logic, other electronic circuits, or suitable combination thereof that include a number of electronic components for performing the functionality of instructions stored on memory resource 114. The term "logic" can, in some implementations, be an alternative or additional processing resource to perform a particular action and/or function, etc., described herein, which includes hardware, e.g., various forms of transistor logic, application specific integrated circuits (ASICs), etc., as opposed to machine executable instructions, e.g., software firmware, etc., stored in memory and executable by a processor. Processing resource 112 can, for example, be implemented across multiple processing units and instructions may be implemented by different processing units in different areas of computing device 110.

Memory resource 114 of computing device 110 can, for example, be in the form of a non-transitory machine-readable storage medium, such as a suitable electronic, magnetic, optical, or other physical storage apparatus to contain or store information such as machine-readable instructions 116, 118, 120, and 122. Such instructions can be operative to perform one or more functions described herein, such as those described herein with respect to method 100 or other methods described herein. Memory resource 114 can, for example, be housed within the same housing as processing resource 112 for computing device 110, such as within a computing tower case for computing device 110 (in implementations where computing device 110 is housed within a computing tower case). In some implementations, memory resource 114 and processing resource 112 are housed in different housings. As used herein, the term "machine-readable storage medium" can, for example, include Random Access Memory (RAM), flash memory, a storage drive (e.g., a hard disk), any type of storage disc (e.g., a Compact Disc Read Only Memory (CD-ROM), any other type of compact disc, a DVD, etc.), and the like, or a combination thereof. In some implementations, memory resource 114 can correspond to a memory including a main memory, such as a Random Access Memory (RAM), where software may reside during runtime, and a secondary memory. The secondary memory can, for example, include a nonvolatile memory where a copy of machine-readable instructions are stored. It is appreciated that both machine-readable instructions as well as related data can be stored on memory mediums and that multiple mediums can be treated as a single medium for purposes of description.

Memory resource 114 can be in communication with processing resource 112 via a communication link 124. Each communication link 124 can be local or remote to a machine (e.g., a computing device) associated with processing resource 112. Examples of a local communication link 124 can include an electronic bus internal to a machine (e.g., a computing device) where memory resource 114 is one of volatile, non-volatile, fixed, and/or removable storage medium in communication with processing resource 112 via the electronic bus.

In some implementations, one or more aspects of computing device 110 can be in the form of functional modules that can, for example, be operative to execute one or more processes of instructions 116, 118, 120, or 122 or other functions described herein relating to other implementations of the disclosure. As used herein, the term "module" refers to a combination of hardware (e.g., a processor such as an integrated circuit or other circuitry) and software (e.g., machine- or processor-executable instructions, commands, or code such as firmware, programming, or object code). A combination of hardware and software can include hardware only (i.e., a hardware element with no software elements), software hosted at hardware (e.g., software that is stored at a memory and executed or interpreted at a processor), or hardware and software hosted at hardware. It is further appreciated that the term "module" is additionally intended to refer to one or more modules or a combination of modules. Each module of computing device 110 can, for example, include one or more machine-readable storage mediums and one or more computer processors.

In view of the above, it is appreciated that the various instructions of computing device 110 described above can correspond to separate and/or combined functional modules. For example, instructions 116 can correspond to a "workload constraints determination module" to determine workload constraints for placement of IT equipment within a data center. Likewise, instructions 120 can correspond to a "capability inference module" to infer hardware placement capabilities of IT equipment racks within a data center. It is further appreciated that a given module can be used for multiple functions. As but one example, in some implementations, a single module can be used to both determine workload constraints as well as to infer hardware placement capabilities.

Figure 7:
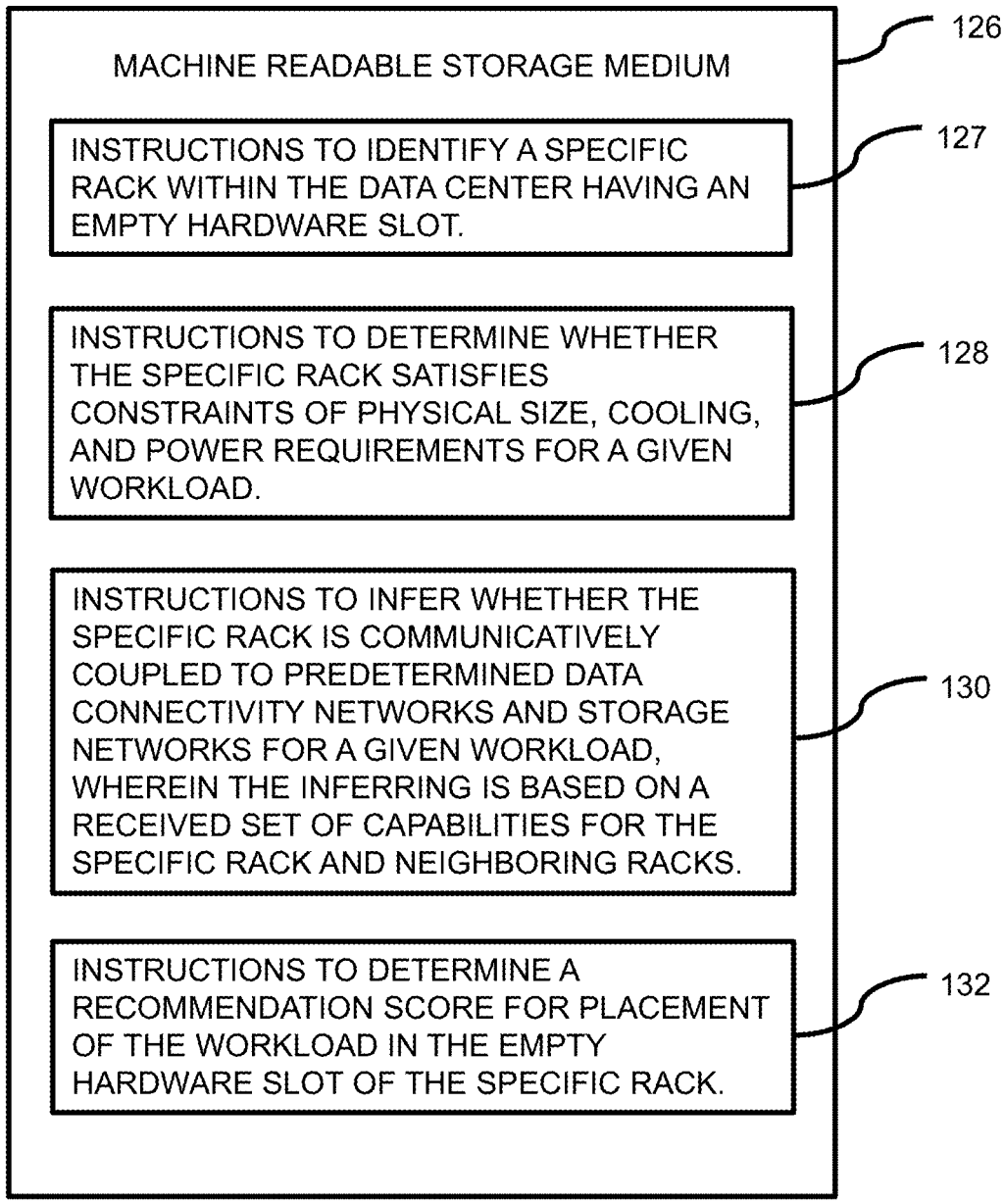
FIG. 7 is a diagram of machine-readable storage medium, according to an example.

FIG. 7 illustrates a machine-readable storage medium 126 including various instructions that can be executed by a computer processor or other processing resource. In some implementations, medium 126 can be housed within a server or on another suitable computing device. For illustration, the description of machine-readable storage medium 126 provided herein makes reference to various aspects of computing device 110 (e.g., processing resource 112) and other implementations of the disclosure (e.g., method 100). Although one or more aspects of computing device 110 (as well as instructions such as instructions 116, 118, 120, and 122) can be applied to or otherwise incorporated with medium 126, it is appreciated that in some implementations, medium 126 may be stored or housed separately from such a system. For example, in some implementations, medium 126 can be in the form of Random Access Memory (RAM), flash memory, a storage drive (e.g., a hard disk), any type of storage disc (e.g., a Compact Disc Read Only Memory (CD-ROM), any other type of compact disc, a DVD, etc.), and the like, or a combination thereof.

Medium 126 includes machine-readable instructions 127 stored thereon to cause processing resource 112 to identify a specific rack within the data center having an empty hardware slot. Instructions 127 can, for example, incorporate one or more aspects of method 100 or another suitable aspect of other implementations described herein (and vice versa). Medium 126 includes machine-readable instructions 128 stored thereon to cause processing resource 112 to determine whether the specific rack satisfies constraints of physical size, cooling, and power requirements for a given workload. Instructions 128 can, for example, incorporate one or more aspects of method 100 or another suitable aspect of other implementations described herein (and vice versa).

Medium 126 includes machine-readable instructions 130 stored thereon to cause processing resource 112 to infer whether the specific rack is communicatively coupled to predetermined data connectivity networks and storage networks for a given workload, wherein the inferring is based on a received set of capabilities for the specific rack and neighboring racks. In some implementations, the inferring is weighted based on proximity between the specific rack and neighboring racks. In some implementations, the proximity is determined based on a data center floorplan that includes the specific rack and the neighboring racks. In some implementations, the proximity is determined based on a number of hops between the specific rack and the neighboring racks. Instructions 130 can, for example, incorporate one or more aspects of method 100 or another suitable aspect of other implementations described herein (and vice versa).

Medium 126 includes machine-readable instructions 132 stored thereon to cause processing resource 112 to determine a recommendation score for placement of the workload in the empty hardware slot of the specific rack. Instructions 132 can, for example, incorporate one or more aspects of method 100 or another suitable aspect of other implementations described herein (and vice versa).

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be appreciated that the systems and methods described herein can include various combinations and/or sub-combinations of the components and/or features of the different implementations described. Thus, features described with reference to one or more implementations can be combined with other implementations described herein.

As used herein, "logic" is an alternative or additional processing resource to perform a particular action and/or function, etc., described herein, which includes hardware, e.g., various forms of transistor logic, application specific integrated circuits (ASICs), etc., as opposed to machine executable instructions, e.g., software firmware, etc., stored in memory and executable by a processor. Further, as used herein, "a" or "a number of" something can refer to one or more such things. For example, "a number of widgets" can refer to one or more widgets. Also, as used herein, "a plurality of" something can refer to more than one of such things.

What is claimed is:

1. A method comprising:
    determining, by a system comprising a hardware processor, workload constraints for placement of information technology (IT) equipment within a data center;
    determining, by the system, physical constraints for placement of the IT equipment;
    inferring, by the system, capabilities of IT equipment racks within the data center, wherein the inferred capabilities of a given IT equipment rack of the IT equipment racks comprise a combination of:
        a first union of sets of capabilities for IT equipment within the given IT equipment rack, and
        a weighted second union of sets of capabilities for IT equipment within a neighboring IT equipment rack of the IT equipment racks, wherein the weighted second union of sets of capabilities is weighted by a weighting factor corresponding to a distance between the neighboring IT equipment rack and the given IT equipment rack; and
    generating, by the system, a ranked collection of locations for IT equipment placement within the data center based on the determined workload constraints, the determined physical constraints, and the inferred capabilities.

2. The method of claim 1, wherein the first union of sets of capabilities for the IT equipment within the given IT equipment rack includes a union of sets of networks to which computers within the given IT equipment rack are able to connect, and
    wherein the weighted second union of sets of capabilities for the IT equipment within the neighboring IT equipment rack includes a weighted union of sets of networks to which computers within the neighboring IT equipment rack are able to connect.

3. The method of claim 1, wherein the first union of sets of capabilities for the IT equipment within the given IT equipment rack includes a union of Ethernet networks and storage networks to which computers within the given IT equipment rack are able to connect, and
    wherein the weighted second union of sets of capabilities for the IT equipment within the neighboring IT equipment rack includes a weighted union of sets of Ethernet networks and storage networks to which computers within the neighboring IT equipment rack are able to connect.

4. The method of claim 1, wherein the neighboring IT equipment rack is a first neighboring IT equipment rack, and wherein the inferred capabilities of the given IT rack comprise a combination of:
    the first union of sets of capabilities for the IT equipment within the given IT equipment rack,
    the weighted second union of sets of capabilities for the IT equipment within the first neighboring IT equipment rack, and
    a weighted third union of sets of capabilities for IT equipment within a second neighboring IT equipment rack of the IT equipment racks, wherein the weighted third union of sets of capabilities is weighted by a second weighting factor corresponding to a second distance between the second neighboring IT equipment rack and the given IT equipment rack.

5. The method of claim 1, wherein the distance between the neighboring IT equipment rack and the given IT equipment rack is determined based on a breadth first search (BFS) analysis between the neighboring IT equipment rack and the given IT equipment rack.

6. The method of claim 1, wherein the workload constraints include one or more of compute constraints, memory constraints, and storage constraints for a given workload.

7. The method of claim 1, wherein the workload constraints include security policy constraints for a given workload.

8. The method of claim 1, wherein the workload constraints include data privacy constraints for a given workload.

9. The method of claim 1, wherein the physical constraints include network constraints for the given IT equipment rack.

10. The method of claim 1, wherein the physical constraints include power constraints for the given IT equipment rack.

11. The method of claim 1, wherein the physical constraints include thermal constraints for the given IT equipment rack.

12. A non-transitory machine readable storage medium comprising machine readable instructions that upon execution cause a system to:
    identify a first rack of a plurality of racks within a data center having an empty hardware slot;
    determine whether the first rack satisfies constraints relating to a physical size, a cooling requirement, and a power requirement for a first computer to execute a given workload; and
    infer network capabilities of the first rack, wherein the inferred network capabilities of the first rack comprise a combination of:
        a first union of sets of network capabilities for computers within the first rack, and
        a weighted second union of sets of network capabilities for computers within a neighboring rack of the first rack, wherein the weighted second union of sets of network capabilities is weighted by a weighting factor corresponding to a distance between the neighboring rack and the first rack; and determine a recommendation score for placement of the first computer in the empty hardware slot of the first rack.

13. The non-transitory machine readable storage medium of claim 12, wherein the first union of sets of network capabilities for the computers within the first rack includes a union of sets of networks to which the computers within the first rack are able to connect, and wherein the weighted second union of sets of network capabilities for the computers within the neighboring rack includes a weighted union of sets of networks to which the computers within the neighboring rack are able to connect.

14. The non-transitory machine readable storage medium of claim 13, wherein the machine readable instructions upon execution cause the system to:

determine the distance between the first rack and the neighboring rack based on a data center floorplan that includes the first rack and the neighboring rack.

15. The non-transitory machine readable storage medium of claim 13, wherein the machine readable instructions upon execution cause the system to:

determine the distance between the first rack and the neighboring rack based on a number of hops between the first rack and the neighboring rack.

16. A system comprising:

a processing resource; and a non-transitory storage medium storing machine readable instructions executable on the processing resource to:

determine workload constraints for data center hardware of a data center;

determine physical constraints for the data center hardware;

infer capabilities of a given rack within the data center based on capabilities of the given rack and one or more racks neighboring the given rack, wherein the inferred capabilities of the given rack comprise a combination of:

a first union of sets of capabilities for hardware within the given rack, and a weighted second union of sets of capabilities for hardware within a neighboring rack that neighbors the given rack, wherein the weighted second union of sets of capabilities is weighted by a weighting factor corresponding to a distance between the neighboring rack and the given rack; and generate a hardware placement recommendation based on the determined workload constraints, the determined physical constraints, and the inferred capabilities.

17. The system of claim 16, wherein the first union of sets of capabilities for the hardware within the given rack includes a union of sets of networks to which computers within the given rack are able to connect, and wherein the weighted second union of sets of capabilities for the hardware within the neighboring rack includes a weighted union of sets of networks to which computers within the neighboring rack are able to connect.

18. The system of claim 16, wherein the first union of sets of capabilities for the hardware within the given rack includes a union of Ethernet networks and storage networks to which computers within the given rack are able to connect, and wherein the weighted second union of sets of capabilities for the hardware within the neighboring rack includes a weighted union of sets of Ethernet networks and storage networks to which computers within the neighboring rack are able to connect.

19. The non-transitory machine readable storage medium of claim 12, wherein the first union of sets of network capabilities for the computers within the first rack includes a union of Ethernet networks and storage networks to which the computers within the first rack are able to connect, and wherein the weighted second union of sets of network capabilities for the computers within the neighboring rack includes a weighted union of sets of Ethernet networks and storage networks to which the computers within the neighboring rack are able to connect.

20. The non-transitory machine readable storage medium of claim 12, wherein the neighboring rack is a first neighboring rack, and wherein the inferred network capabilities of the first rack comprise a combination of:

the first union of sets of network capabilities for the computers within the first rack, the weighted second union of sets of network capabilities for the computers within the first neighboring rack, and a weighted third union of sets of network capabilities for computers within a second neighboring rack of the first rack, wherein the weighted third union of sets of network capabilities is weighted by a second weighting factor corresponding to a second distance between the second neighboring rack and the first rack.

* * * * *